United States Patent [19]
Williams et al.

[11] Patent Number: 6,123,024
[45] Date of Patent: Sep. 26, 2000

[54] STENCIL INCORPORATING ELECTRONIC TAG

[75] Inventors: David Godfrey Williams, Merseyside, United Kingdom; Raymond P. Sharpe, East Greenwich, R.I.; A. Jason Mirabito, Hull, Mass.

[73] Assignee: Alpha Metals, Inc., Jersey City, N.J.

[21] Appl. No.: 09/231,490

[22] Filed: Jan. 14, 1999

Related U.S. Application Data

[60] Provisional application No. 60/072,727, Jan. 15, 1998.

[51] Int. Cl.$^7$ .............................. B41M 1/12; B41L 13/00
[52] U.S. Cl. ........................................... 101/129; 101/127
[58] Field of Search ..................... 101/127, 129, 101/128.21, 128.4, 115, 116, 127.1

[56] References Cited

U.S. PATENT DOCUMENTS

| | | | |
|---|---|---|---|
| 4,665,824 | 5/1987 | Greiner et al. | 101/426 |
| 5,058,500 | 10/1991 | Mizuno | 101/142 |
| 5,323,704 | 6/1994 | Fraczek | 101/375 |
| 5,537,920 | 7/1996 | Hasegawa et al. | 101/116 |
| 5,800,856 | 9/1998 | Hong Vuong | 101/127 |

FOREIGN PATENT DOCUMENTS 8702416  5/1989  Netherlands.

*Primary Examiner*—John S. Hilten
*Assistant Examiner*—Daniel J. Colilla
*Attorney, Agent, or Firm*—Mintz, Levin, Cohen, Ferris, Glovsky & Popeo, P.C.

[57] ABSTRACT

A stencil and stencil identification system in which the stencil carries a tagging device capable of storing data corresponding to characteristics of the stencil and the pattern of apertures formed in the stencil. The stencil with tagging device may be utilized in combination with a stencil printing device having a tag reader which reads information data stored within the tagging device and/or writes information into the tagging device relating to characteristics of the stencil or other criteria.

11 Claims, 3 Drawing Sheets

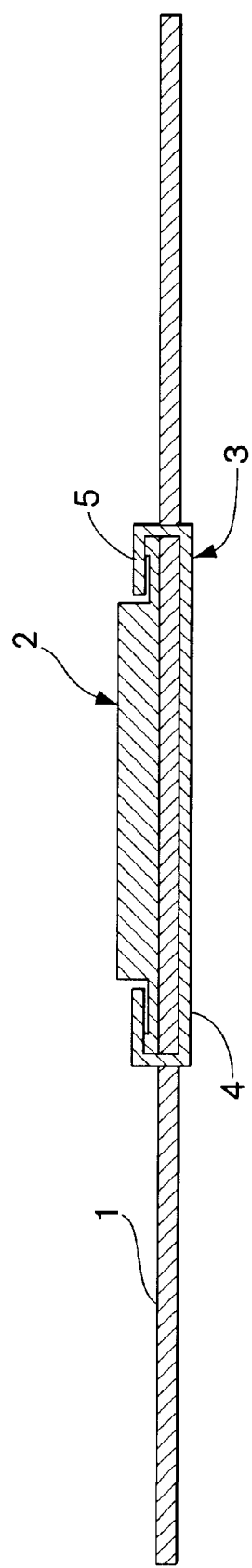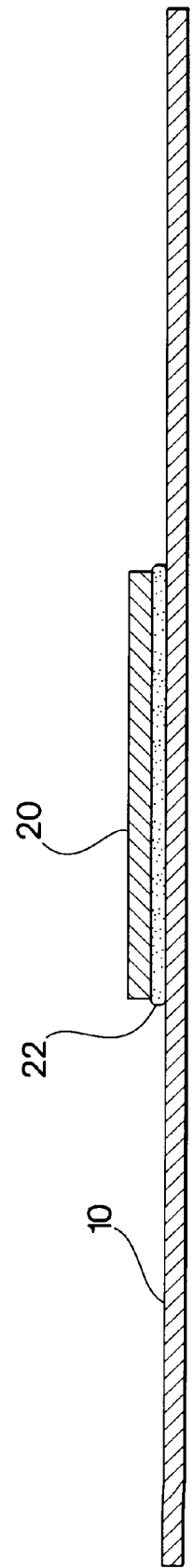

STENCIL INCORPORATING ELECTRONIC TAG

RELATED APPLICATIONS

This application claims priority from U.S. Provisional Application Ser. No 60/072,727 filed Jan. 15, 1998 for a "Stencil Incorporating Electronic Tag", which is incorporated by reference herein.

FIELD OF THE INVENTION

The present invention may be used in conjunction with a stencil or mask suitable for example for enabling the selective application of solder paste onto printed circuit boards. One type of stencil is described in Patent No. GB2264460 of Micro Metallic Limited, which is sold under the commercial name of TETRA FOIL in which a usually metal foil or stencil is stretched over a holding frame. However, embodiments of the present invention may be used with non-foil type stencils such as those stencils which are stretched and prefixed on a frame for insertion into a stencil printing device. The stencil printing machines with which stencils in accordance with embodiments of the present may be used include those which are commercially available from a number of vendors including stencil printers manufactured and sold by the MPM division of Speedline Technologies, Inc., Franklin, Mass. (hereafter "MPM").

BACKGROUND OF THE INVENTION

When preparing a stencil for use in a printing process in a solder stencil printing machine, it is typically necessary to take into account various characteristics of the stencil for the purposes of calibration and quality control of the printing process. Currently, such preparation can take, for example, up to 30 minutes each time a stencil is used and it would be of great advantage to have some means of determining the specific characteristics of a particular stencil in a readily accessible manner to enable such to be quickly read and implemented. Electronic tagging devices for other purposes are known per se and are capable of storing reasonable amounts of data which can be read out utilizing a touch reader or a remote interrogation device, for example a radio frequency (RF) transmitter/receiver, the tag acting as a transponder capable of retransmitting the data contained within the tag when appropriately interrogated by an interrogator/tag reader.

SUMMARY OF THE INVENTION

It is an object of the invention to provide an improved stencil and electronic tag arrangement capable of storing relevant data relating to the identity and characteristics of the stencil or other characteristics and which can be updated to provide, for example, a historical record of use of the stencil, enabling quality control and preparation to be improved and monitored.

According to one embodiment of the present invention, a stencil or mask for a printing apparatus includes an electronic tag/transponder device capable of storing relevant characteristics and other data relating to the characteristics, performance and use of the stencil.

The electronic tag/transponder device may be read either by means of a touch reader or remotely using an RF or other wireless interrogator/tag reader and being capable of being updated during use.

The application of an electronic tag to a stencil enables more rapid and accurate setting up and calibration of the printing apparatus to enable the stencil to be used more efficiently and to enable monitoring of the stencil's performance and use over a period of time.

In addition to being applied to stencils in a printing apparatus, tagging systems in accordance with embodiments of the present invention may be applied also to other forms of machines used in other industrial processes, in particular, electronic assembly operations to enable automatic or semi-automatic operation, including preparation and calibration.

Also according to another embodiment of the present invention, a method is provided for printing solder paste onto electronic circuit boards using a stencil printing machine having an operational control system. The method includes steps of etching or cutting or otherwise aperturing the stencil with a predetermined arrangement of apertures, selecting an electronic electronic tag which is able to withstand cleaning operations for the stencil and securing the electronic tag to an upper surface of the stencil, and storing data in a electronic tag. The data including data related to at least one characteristic of the stencil. The method further including steps of interrogating the electronic tag and off-loading the data into the operational control system of the printing machine, and then operating the printing machine to apply solder paste to a circuit board. While the electronic tag may be mounted on the upper surface of the stencil (the surface through which solder or other material is pressed through), it is also possible to mount the electronic tag on the lower surface of the stencil to accommodate a tag reader which may be mounted on a stencil printing machine to read the lower or bottom surface of a stencil.

Also, according to another embodiment of the present invention, a stencil printing machine is provided having a mounted remote tag or touch tag reader which will read a stencil containing a electronic tag when or after the stencil has been mounted in a stencil printing frame of the stencil printing machine.

Operational data obtained from use of the printing machine may be input into the electronic tag to update the data to provide for improved operation in the future. Also the electronic tag may include data relating to characteristics of solder paste or other substances to be used with the stencil.

The electronic tag may contain data relating, for example, to size, pressure and speed of the printing head to be used, characteristics of the stencil, where used, type of paste to be used, etc. The tag reading device may also be enabled to write data into the electronic tag. The electronic tag and reading device may work optically using infrared or laser transmission techniques in lieu of, for example, RF transmissions.

DESCRIPTION OF THE DRAWINGS

The invention will be described further, by way of example, with reference to the accompanying drawings, in which:

FIG. 2 is a cross-sectional view of the stencil of FIG. 1 taken along the line X—X of FIG. 1.

FIG. 3 is a schematic plan view of a stencil comprising a stencil sheet incorporating a tag or transponder secured to the stencil by adhesive or other non-perforating attachment.

DETAILED DESCRIPTION OF THE INVENTION

Figure 1:
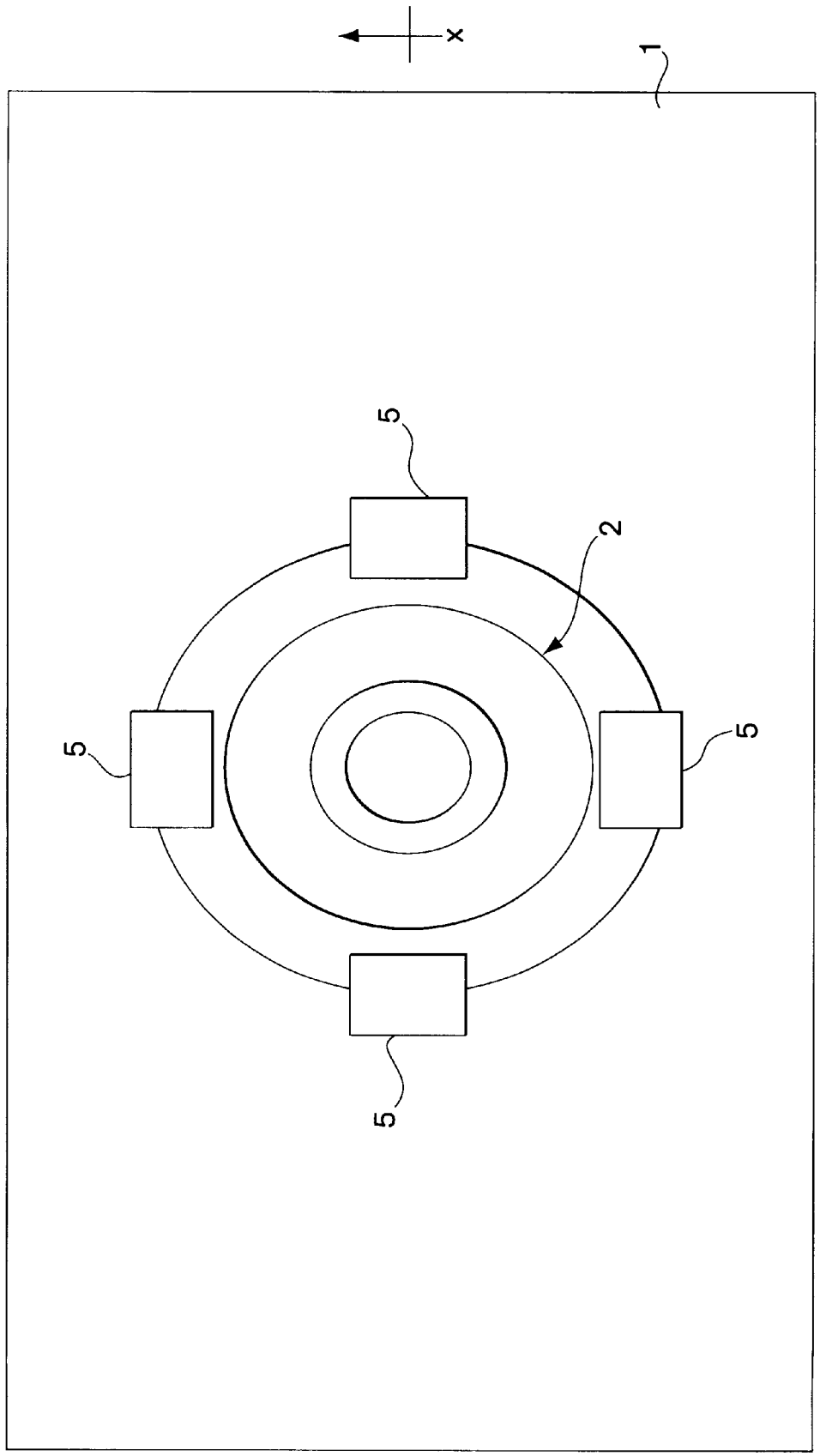
FIG. 1 is a schematic plan view of a stencil comprising a sheet of metal foil incorporating a tag or transponder secured thereto.

In FIGS. 1 and 2 there is illustrated a stencil or mask 1 including an electronic tag or transponder 2 capable of storing relevant characteristics and other data relating to the characteristics, performance and use of the stencil 1. The stencil 1 is only illustrated schematically and would in practice have apertures in a central or other region through which solder paste or other materials might be applied by a squeegee to a substrate such as an electronic circuit board such as is conventionally known in the electronic assembly art.

It is to be noted, with respect to FIG. 1, that the section of the stencil 1 is shown for the purpose of illustration only as being small in size as compared to the electronic tag or transponder 2 whereas in practice the stencil may be much larger than the electronic tag 2 and the electronic tag 2 will be ideally located outside of an area of the stencil containing apertures. Locating the electronic tag 2 away from the apertures prevents the electronic tag 2 from being corrupted by solder paste or other materials used with the stencil. The stencil 1 may be of the type of stencil shown and described in Patent No. GB2264460 which comprises a flexible foil into which apertures have been formed and which is stretched over a frame. The frame and foil are commercially sold under the names of TETRA FOIL™ and TETRA FRAME™, respectively, by Alpha Metals Inc. of Jersey City, N.J. The TETRA upon which the TETRA FOIL has been stretched is placed within a frame holding device within a stencil printer as will be described below with reference to FIG. 4. In addition to the Tetra Foil type of stencil foil, embodiments of the present invention can be utilized as well with a "conventional" framed stencil in which a metal portion perforated with apertures is fixed, to a plastic, metal or other polymeric material pretensioned and permanently mounted on a metal, wooden or other suitable frame. This frame is insertable within a frame mounting device in a stencil printing machine.

The electronic tag/transponder 2 is readable either by a touch reader or remotely using an RF interrogator/tag reader and is capable of being updated during use.

As shown in FIGS. 1 and 2, the electronic tag 2 is secured to stencil 1 by means of a crimp fastener 3 which comprises a disc 4 having four projecting crimp arms 5 initially bent to extend at right angles to the disc 4 and so as to be located to extend through four correspondingly shaped apertures in stencil 1 whereupon the ends of the arms are bent or crimped over onto a peripheral flange of the electronic tag 2 to hold the tag in position on the stencil.

The electronic tag 2 is able to withstand cleaning operations used for the stencil, and in embodiments of the present invention, the tag is secured to the upper surface of the stencil. Data stored in the tag 2 includes data relevant to characteristics of the stencil.

In embodiments of the invention, the tag is interrogated by one or more suitable devices and the data stored in the tag are off-loaded into the operational control system of a printing machine which is then operated to apply a substance such as solder paste to a substrate, such as a circuit board, using the stencil.

FIG. 3 illustrates an alternative embodiment for mounting a electronic tag 20 to a stencil 10. In this embodiment, rather than the mechanical crimp arms 5 illustrated in FIGS. 1 and 2, the tag is securely mounted on the stencil 10 by welding the tag to the stencil or by some other adhesive application (as indicated by 22 in FIG. 3). In another embodiment, the tag 20 is mounted to the stencil 10 by etching the stencil surface, embedding the tag within the etched surface, and the using conventional screws or rivets, etc to fasten the tag to the stencil.

Figure 4:
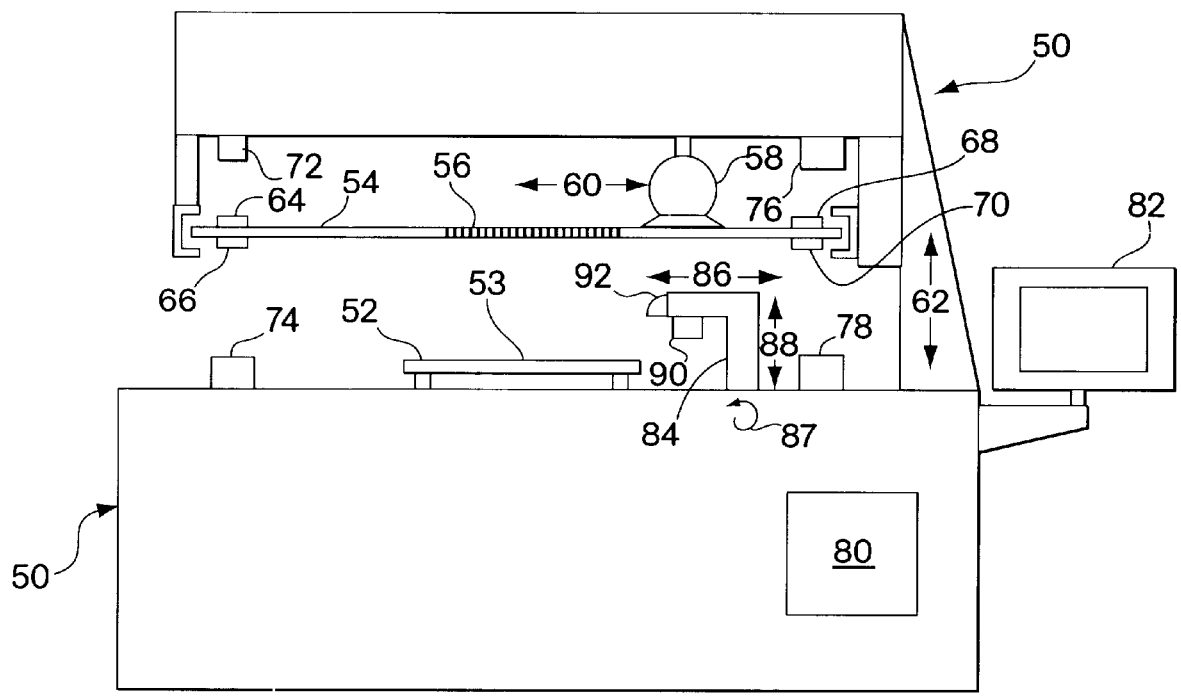
FIG. 4 is a schematic side view of a stencil mounted in a stencil printer illustrating transponders which are utilized to read or write data onto a electronic tag attached to the stencil.

FIG. 4 illustrates a side view of a stencil printer 50. In the stencil printer 50, a printed circuit board 52 is placed on a platform or stage within the stencil printer 50 prior to the application of solder paste or other material onto the upper surface 53 of the circuit board 52. In embodiments of the invention, the circuit board may be transported to the stage using a conveyor system. A stencil 54 is shown mounted above the printed circuit board 52. The stencil 54 contains a number of apertures 56 through which solder paste or other material is pushed through onto the upper surface 53 of printed circuit board 52. It is noted that the solder paste or other material is pushed or "squeegeed" through the apertures 56 onto the upper surface of the circuit board 52 through the operation of print head 58 which operates in directions 60 to push solder paste or other material through apertures 56. In operation of the stencil printer 50, the stencil 54 is placed in close proximity to, if not in contact with, the upper surface 53 of the printed circuit board 52. Arrows 62 illustrate the movement down and up of the screen from the printed circuit board prior to and after squeegeeing of solder paste. In other embodiments, the circuit board may be raised to place it in close proximity to or in contact with the screen.

Embodiments of the present invention may be practiced in conjunction with a screen printer such as the AP 3000 screen printing machine sold by the MPM division of Speedline Technologies, Inc. and the solder dispensing device 58 may include a rheometric pump assembly also sold by MPM. In addition, embodiments of the invention may be used with other conventional solder depositing apparatus well known to those of skill in the art.

Stencil 54 includes 4 electronic tags 64, 66, 68 and 70 and printer 50 includes four tag readers 72, 74, 76 and 78. Each tag reader is used to read one of the electronic tags. As understood by one skilled in the art, four tags and four tag readers are shown for purposes of illustration inasmuch as only one tag and one tag reader may be necessary and/or desirable.

In the printing of printed circuit boards using solder paste or other materials, a number of variations occur from one stencil to another stencil. The most common variation is that of the pattern of apertures which have been formed in the stencil. The pattern of apertures corresponds to a desired pattern of solder paste or material for a particular type of circuit board. Typically, a company engaged in the use of stencil printing devices such as stencil printer 50 will stock a variety of different stencils, each having a different stencil pattern corresponding to a particular circuit board which is to be printed upon. In embodiments of the present invention, one or more of the electronic tags 64, 66, 68, 70 contains data identifying the particular pattern of apertures formed on the stencil 54.

A computer 80 of the stencil printer 50 is operatively coupled to one or more of the tag readers 72, 74, 76 and 78, and is programmed to receive data from the tag readers and to analyze the data. The computer is also programmed to identify the particular circuit board pattern of the stencil placed into the stencil printer based on the analysis of the received data. If the circuit board pattern of the stencil does not match a pattern of circuit boards to be entered into the printer, the computer may generate an error code on a screen 82 to notify a user of the stencil printer 50 of a possible error condition.

In addition to containing data related to the aperture pattern of the stencil, the electronic tags 64, 66, 68, 70 may also contain information or other data such as: the type or viscosity or composition of the solder paste which is ideally suited to the particular aperture pattern; the temperature of the solder paste which should be utilized; the number circuit boards for which the stencil has been utilized and/or the total time over which the stencil has been used. The number of boards printed by and/or the operational time of a stencil may be used to determine the remaining operational life of the stencil.

In embodiments of the invention, the tag readers 72, 74, 76 and 78 may, in addition to being capable of reading data contained in electronic tags 64, 66, 68, 70, may also be capable of inputting information into the electronic tags 64, 66, 68, 70 and updating existing data in the tag readers. Thus, the readers 72 through 78 may operate both as receivers and transmitters of information. The readers 72 through 78 are shown in FIG. 4 as not being in contact with the devices 64 through 70, however, as understood by one skilled in the art the readers 72–78 may also be implemented using a contact type transmitter or receiver which would transmit information to and receive information from devices 64 through 70. Such readers are well known in the art and may include proximity readers as well as plug in modules which physically connect to one or more of the devices 64 through 70.

In present day screen printers, including the Model AP 3000 stencil printer manufactured and sold by MPM, prior to the printing of a substance on a circuit board, the stencil is properly aligned with the printed circuit board 52 to ensure accurate deposition of the substance on the upper surface 53 of the circuit board. Such printers may include an automatic vision system, mounted for movement in the area between the stencil and the board, which contains a camera or other video device to view the lower surface of the screen stencil and the upper surface of the stencil to determine whether they are in alignment. Stencil printer 50 includes such a vision alignment system, shown schematically at 84, moveable in a number of directions over the printed circuit board 52 and within the area between the stencil 54 and the printed circuit board 52, as shown by the arrows 86, 87 and 88. The vision alignment system includes a camera 90 or a video device similar to a camera.

In an alternative embodiment of the present invention, in lieu of the fixed readers 72, 74, 76 and 78, the vision alignment system 84 includes, in addition to the camera 90, a tag reading mechanism 92. The tag reading mechanism 92 is moveable under the entire or virtually entire surface of stencil 54 and thus may be brought into alignment with electronic tags 66 and/or 70 to read data from or write data into the tagging devices.

Having thus described at least one illustrative embodiment of the present invention, various alterations, modifications and improvements will readily occur to those skilled in the art. Such alterations, modifications and improvements are intended to be within the scope and spirit of the invention. Accordingly, the foregoing description is by way of example only and is not intended as limiting. The invention's limit is defined only in the following claims and the equivalents thereto.

What is claimed is:

1. A stencil printer for printing a substance on a circuit board, the stencil printer comprising:

a stage for holding a circuit board upon which the substance is to be printed;

a stencil having a non-apertured portion and a portion in which apertures are formed, the apertures forming a pattern corresponding to a pattern of the substance to be printed upon the circuit board, the stencil including at least one tag mounted on the stencil, the electronic tag capable of storing data relating to the stencil;

a printing device constructed and arranged to dispense the substance through the apertures of the stencil;

at least one tag reader constructed and arranged to read data stored within the electronic tag; and a tag writer constructed and arranged to write data to the electronic tag on the stencil.

2. The stencil printer of claim 1, wherein the electronic tag contains data relating to characteristics of a desired substance to be used with the stencil for printing on a circuit board.

3. The stencil of claim 2, wherein the electronic tag contains data relating to at least one of the following: size of printing head to be used with the stencil, pressure to be applied to the stencil during printing, speed of the printing device across the stencil during printing, characteristics of the stencil, a type of solder paste desired for use with the stencil, and a desired temperature of solder paste to be used with the stencil.

4. The stencil printer of claim 3, further comprising an inspection head mounted within the stencil printer, the inspection head being coupled to the tag reader to position the tag reader adjacent the electronic tag.

5. The stencil printer of claim 1, wherein the electronic tag contains data relating to characteristics of a desired substance to be used with the stencil for printing on a circuit board.

6. The stencil printer of claim 1, wherein the electronic tag contains data relating to at least one of the following: size of printing head to be used with the stencil, pressure to be applied to the stencil during printing, speed of the printing device across the stencil during printing, characteristics of the stencil, a type of solder paste desired for use with the stencil, and a desired temperature of solder paste to be used with the stencil.

7. The stencil printer of claim 1, further comprising an inspection head mounted within the stencil printer, the inspection head being coupled to the tag reader to position the tag reader adjacent the electronic tag.

8. A method of printing solder paste onto a circuit board using a stencil printing machine having an operational control system and a stencil having apertures, the apertures forming a pattern corresponding to a pattern of the solder paste to be printed on the circuit board, the method comprising steps of:

selecting an electronic tag;

securing the electronic tag to the stencil;

storing data in the electronic tag;

interrogating the electronic tag and off-loading the data into the operational control system of the printing machine; and operating the printing machine to apply solder paste to a printed circuit board.

9. The method of claim 8, wherein the step of storing data in the electronic tag includes storing data relating to characteristics of the stencil.

10. The method of claim 8, further comprising a step of transferring information from the operational control system of the printing machine to the electronic tag.

11. The method of claim 10, wherein the step of transferring data includes a step of updating in the electronic tag.

* * * * *

UNITED STATES PATENT AND TRADEMARK OFFICE
CERTIFICATE OF CORRECTION

PATENT NO. : 6,123,024
DATED : September 26, 2000
INVENTOR(S) : Williams, et. al.

It is certified that error appears in the above-identified patent and that said Letters Patent is hereby corrected as shown below:

Column 1, line 26, after "MPM", insert --MA--.

Column 2, line 17, after the word "an", delete --electronic--.

Column 2, line 19, change "a" to --an--.

Column 2, line 34, change "a" to --an--..

Column 2, line 60, after "FIG. 1", insert --;--.

Column 2, line 63, after "attachment", insert --; and--

Column 3, line 28, after "TETRA" (first occurrence), insert --FRAME--.

Column 3, line 31, change "Tetra Foil" to --TETRA FOIL--.

Column 3, line 63, delete the word "electronic".

UNITED STATES PATENT AND TRADEMARK OFFICE
CERTIFICATE OF CORRECTION

PATENT NO. : 6,123,024
DATED : September 26, 2000
INVENTOR(S) : Williams, et. al.

It is certified that error appears in the above-identified patent and that said Letters Patent is hereby corrected as shown below:

Column 4, line 3, change the word "the" (first occurrence) to --then--.

Column 5, line 16, delete "readers" and insert --devices--.

Column 5, line 24, delete "devices" and insert --electronic tags--.

Column 5, line 24, delete "readers" and insert --electronic tags--.

Column 5, line 27, delete "devices" and insert --electronic tags--.

Signed and Sealed this

Twenty-second Day of May, 2001

*Attest:*

NICHOLAS P. GODICI

*Attesting Officer*      Acting Director of the United States Patent and Trademark Office